United States Patent
Lu et al.

(10) Patent No.: US 7,250,364 B2
(45) Date of Patent: Jul. 31, 2007

(54) SEMICONDUCTOR DEVICES WITH COMPOSITE ETCH STOP LAYERS AND METHODS OF FABRICATION THEREOF

(75) Inventors: Yung-Cheng Lu, Taipei (TW); Tien-I Bao, Hsinchu (TW); Su-Hong Lin, Tainan Hsien (TW); Syun-Ming Jang, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 219 days.

(21) Appl. No.: 10/995,923

(22) Filed: Nov. 22, 2004

(65) Prior Publication Data

US 2006/0110912 A1    May 25, 2006

(51) Int. Cl.
*H01L 21/4763* (2006.01)
(52) U.S. Cl. .............. 438/624; 257/637; 257/642; 257/760; 257/E21.249
(58) Field of Classification Search .......... 257/637, 257/642, 760, E21.249
See application file for complete search history.

(56) References Cited

U.S. PATENT DOCUMENTS 6,265,780 B1 * 7/2001 Yew et al. ............... 257/759
6,525,428 B1 * 2/2003 Ngo et al. ............... 257/774
6,798,043 B2 * 9/2004 Steiner et al. ........... 257/637

FOREIGN PATENT DOCUMENTS

TW    200411765    7/2004

* cited by examiner

*Primary Examiner*—Asok Kumar Sarkar
(74) *Attorney, Agent, or Firm*—Thomas, Kayden, Horstemeyer & Risley

(57) ABSTRACT

Semiconductor devices with composite etch stop layers and methods of fabrication thereof. An semiconductor device with a composite etch stop layer includes a substrate having a conductive member, a first etch stop layer on the substrate and the conductive member, a second etch stop layer and a dielectric layer sequentially over the second etch stop layer, having a conductive layer therein down through the dielectric layer, the second etch stop layer and the first etch stop layer to the conductive member.

16 Claims, 2 Drawing Sheets

SEMICONDUCTOR DEVICES WITH COMPOSITE ETCH STOP LAYERS AND METHODS OF FABRICATION THEREOF

BACKGROUND

The present invention relates to semiconductor fabrication, and in particular to semiconductor devices with composite etch stop layers and related fabrication methods.

Large, advanced semiconductor integrated circuits typically contain a large number of metallization levels to allow for the complex electrical interconnects required for the millions of semiconductor devices included in such integrated circuits.

The reduction in size of such integrated circuits has resulted in levels of electrically conductive interconnects being placed closer together vertically, as well as horizontally. As a result, capacitance has increased between such conductive portions, resulting in loss of speed and increased cross-talk. One proposed approach to solve this problem of high capacitance is to replace the conventional silicon oxide ($SiO_2$) dielectric material used in the damascene wiring technology with another insulation material having a lower dielectric constant to thereby lower the capacitance.

Normally, a silicon nitride layer is often used in an integrated circuit structure as an etch stop layer. However, problems such as via poisoning, resist scumming and via blinding can occur in the integrated circuit structure utilizing a dielectric layer. For example, in an integrated circuit structure using a low-k dielectric layer and nitrogen-containing silicon nitride etch stop layer, such problems can occur due to outgassing. Also, a single etch stop layer may provide insufficient etching selectivity relative to a dielectric layer formed thereon. Thus, undesired breakthrough might happen that can damage the integrated circuit structure.

SUMMARY

Accordingly, an embodiment of the invention provides a method for forming an interconnect structure with composite etch stop layer. In the method, a substrate having a conductive member is first provided. A first etch stop layer is formed on the substrate. A second etch stop layer is formed on the first etch stop layer. A dielectric layer is formed over the second etch stop layer. The dielectric layer, the second etch stop layer and the first etch stop layer are sequentially patterned to form an opening therein, exposing the substrate and a portion of the conductive member. A conductive material fills the opening to form a conductive feature, electrically connecting the conductive member.

In another embodiment of the invention, a semiconductor device is provided. The semiconductor device includes a substrate having a conductive member and an interconnect structure. The interconnect structure includes a first etch stop layer on the substrate and the conductive member, a second etch stop layer on the first etch stop layer, a dielectric layer over the second etch stop layer, and a conductive layer formed in the dielectric layer, the second etch stop layer and the first etch stop layer to form a conductive feature, electrically connecting the conductive member.

BRIEF DESCRIPTION OF THE DRAWINGS

Embodiments of the invention can be more fully understood by reading the subsequent detailed description and examples with reference made to the accompanying drawings, wherein.

DESCRIPTION

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers. By use of the term "low dielectric constant" or "low-k" herein, is meant a dielectric constant (k value) which is less than the dielectric constant of a conventional silicon oxide. Preferably, the dielectric constant of the low-k is less than about 4.0.

FIGS. 1-4 are cross sections of a portion of a substrate during fabrication of an interconnect structure according to an embodiment of the invention, showing a method for fabricating a semiconductor device with composite etch stop layer.

Figure 1:
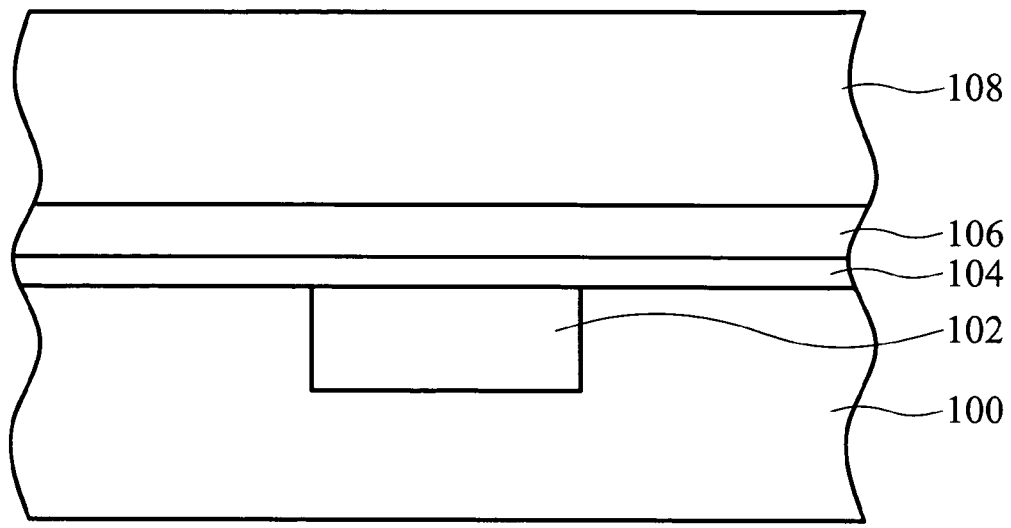
FIG. 1 is a cross section of a portion of a substrate showing a fabrication step of the method for forming an interconnect structure with composite etch stop layer according to an embodiment of the invention.

In FIG. 1, a semiconductor substrate 100, for example a silicon substrate, with semiconductor devices or other existing conductive lines thereon is first provided. The substrate 100 is illustrated as a flat substrate here for simplicity. Herein the semiconductor substrate 100 is also provided with a conductive member 102 for electrically connecting one of the underlying semiconductor devices or conductive lines (both not shown).

Next, a first etch stop layer 104 and a second etch stop layer 106 are sequentially formed on the semiconductor substrate 100 and the conductive member 102. Herein, the first etch stop layer 104 preferably comprises an oxygen-free material such as silicon carbide (SiC) formed by plasma enhanced chemical vapor deposition (PECVD). The second etch stop layer 106 preferably comprises an oxygen-containing material such as silicon oxycarbide (SiOC) or silicon carbide which is bonded with an organic group R (SiOCR) formed by plasma enhanced chemical vapor deposition (PECVD). The organic group R can be phenyl group, alkyl group, group or cyclic group. The first etch stop layer 104 and the second etch stop layer 106 can be in-situ formed by single PECVD process performed by a cluster PECVD tool. In addition, both of the first etch stop layer 104 and the second etch stop layer 106 are formed on the conductive member 102 and are not level with the conductive member 102.

Preferably, the organic group R has an atomic weight larger than 15. Thicknesses of the first etch stop layer 104 and the second etch stop layer 106 are about 10~100 Å and 300~600 Å, respectively. A dielectric layer 108 is then formed over the second etch stop layer 106 by a method such as chemical vapor deposition (CVD).

Preferably, material of the dielectric layer 108 can be low-k dielectrics with an inherent dielectric constant lower than the undoped silicon dioxide which is about 4.0 such as carbon-doped silicon dioxide materials, fluorinated silicate glass (FSG), organic silicate glass (OSG), fluorine doped silicon oxide, spin-on glasses, silsesquioxane, benzocyclobutene (BCB)-based polymer dielectrics and any silicon containing low-k dielectric. Thickness of the dielectric layer is about 1000~7000 Å.

Herein, a composite etch stop layer composed of the first etch stop layer 104 and the second etch stop layer 106 is thus disposed between the dielectric layer 108 and the substrate 100. Reactants for forming of the first etch stop layer 104 using PECVD include $H_xSi(CH_3)_{4-x}$, He, and Ar without oxygen atoms when the first etch stop layer 104 comprises silicon carbide (SiC). Thus oxidation to the underlying conductive member 102 can be reduced during formation. Preferably, process temperature and process pressure for forming the silicon carbide (SiC) layer by PECVD are about 250~400° C. and 1~6 Torr, respectively. Flow rates of the described reactants are about 50~600 sccm for $H_xSi(CH_3)_{4-x}$, 100~2000 sccm for He and 100~2000 sccm for Ar. In addition, RF power about 50~600 W is used in the described PECVD.

Reactants for forming the material of the second etch stop layer 106 includes $H_xSi(CH_3)_{4-x}$, $H_xSi(R)_{4-x}$, He, Ar and $CO_2$ when the second etch stop layer 106 comprises silicon oxycarbide bonded with an organic group R (SiOCR). In addition, the composite etch stop layer also increases adhesion between the dielectric layer 108 and the substrate 100. Preferably, process temperature and process pressure for forming the silicon oxycarbide bonded with an organic group R (SiOCR) by PECVD are about 250~400° C. and 1~6 Torr, respectively. Flow rates of the described reactants are about 50~600 sccm for $H_xSi(CH_3)_{4-x}$, 50~600 sccm for $H_xSi(R)_{4-x}$, 100~2000 sccm for He, 100~2000 sccm for Ar and 50~500 sccm for $CO_2$. In addition, in the described PECVD, a RF power about 50~600 W is used.

Figure 2:
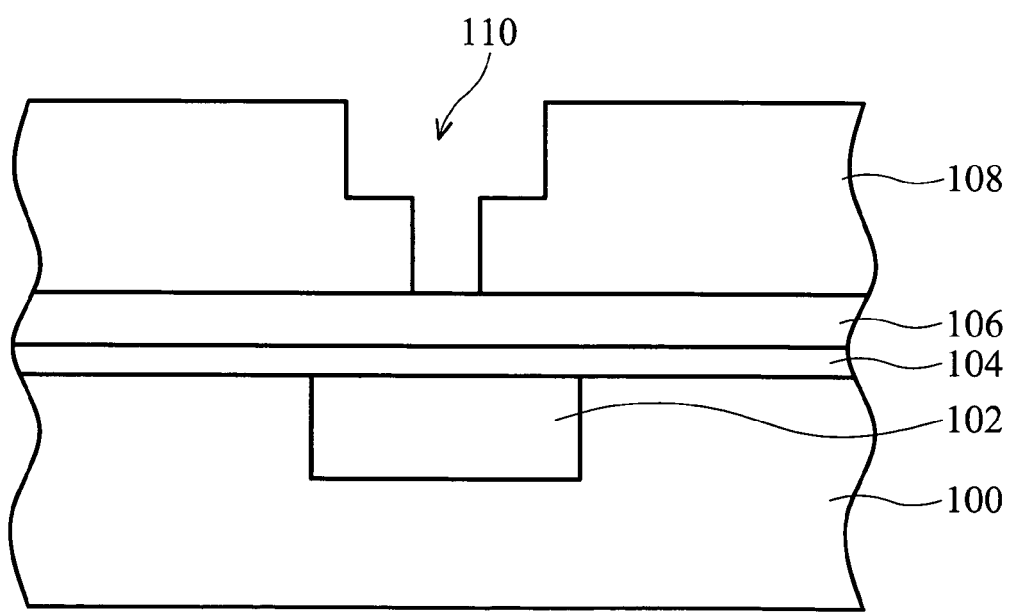
FIG. 2 is a cross section of a portion of a substrate showing another fabrication step of the method for forming an interconnect structure with composite etch stop layer according to an embodiment of the invention.

In FIG. 2, an opening 110 having a lower via portion and an upper trench portion is then formed in the dielectric layer 108 using a known dual damascene process. This exposes a portion of the second etch stop layer 106. The opening 110 can be formed by a trench first dual damascene process or via first dual damascene process, for example. An optional etch stop layer (not shown) can be further formed in the dielectric layer 108 to provide etch stop when forming the opening 110.

Figure 3:
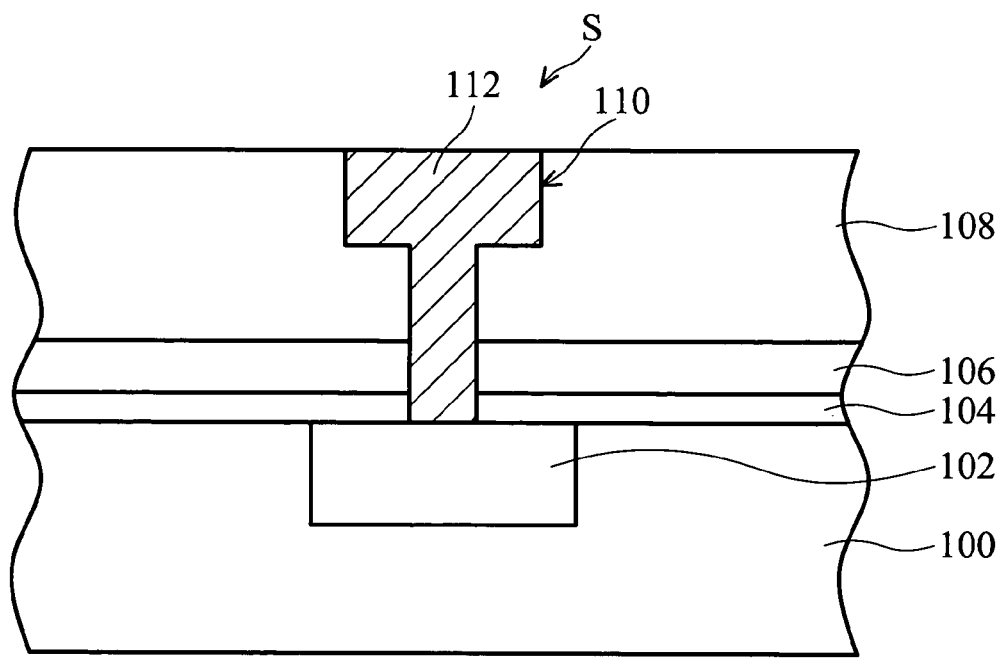
FIG. 3 is a cross section of a portion of a substrate showing yet another fabrication step of the method for forming an interconnect structure with composite etch stop layer according to an embodiment of the invention.

In FIG. 3, the first etch stop layer 104 and the second etch stop layer 108 are then in-situ and sequentially etched to expose a portion of the underlying conductive member 102. An electrically conductive layer 112 is then formed in the opening 110 by sequential deposition and planarization of a conductive material such as copper or copper alloy. A conductive feature S is thus formed within the dielectric layer 108, serving as a conductive plug and a conductive line.

As shown in FIG. 3, an embodiment of a semiconductor device is illustrated. The semiconductor device includes a substrate having a lower conductive structure and an interconnect structure with composite etch stop layer formed on the substrate. In the interconnect structure, a first etch stop layer is formed on the substrate and the lower conductive structure, wherein the first etch stop layer is not level with the lower conductive structure. A second etch stop layer is formed on the first etch stop layer. A dielectric layer is formed over the second etch stop layer. An opening is formed through the dielectric layer, the second etch stop layer and the first etch stop layer down to the lower conductive member and a conductive layer is formed in the opening to form a conductive feature, electrically connecting the lower conductive member.

Figure 4:
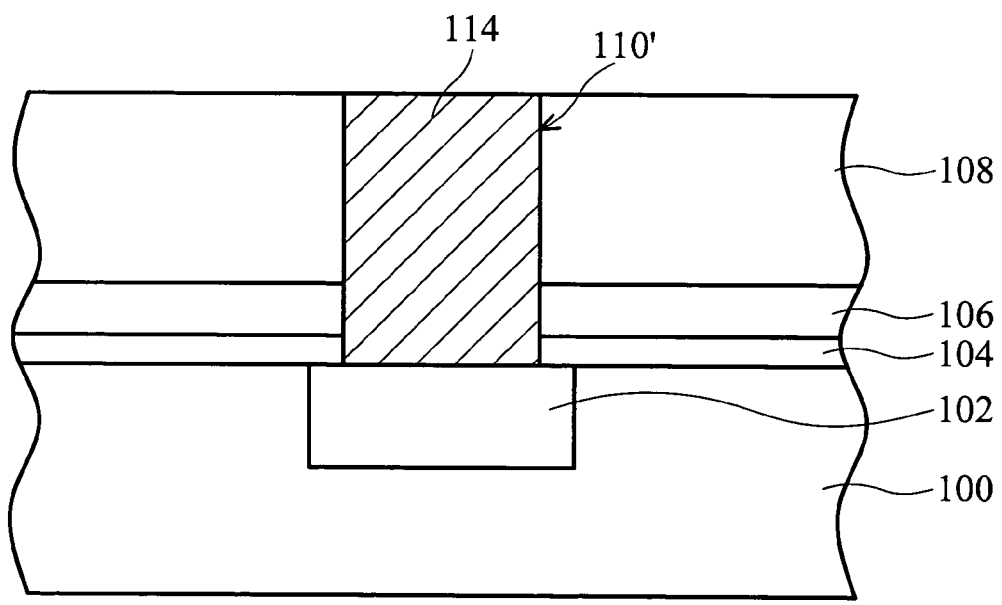
FIG. 4 is a cross section of a portion of a substrate showing yet another fabrication step of the method for forming an interconnect structure with composite etch stop layer according to an embodiment of the invention.

In FIG. 4, another embodiment of a semiconductor device with a composite etch stop layer is illustrated. As shown in FIG. 4, a conductive layer 114 is formed within an opening 110' disposed within the dielectric layer 108. A conductive line or a conductive plug is then formed in the opening 110' to electrically connecting the underlying conductive member 102.

One potential advantage of some embodiments is that the underlying etch stop layer (e.g. the first etch stop layer 104) can act as a glue layer to improve the adhesion between underlying substrate and the overlying etch stop layer (e.g. the second etch stop layer 106).

In some embodiments, the composite etch stop layer may formed of nitrogen-free material, thus preventing problems such as via poisoning, resist scumming and via blinding currently occurred in a damascene-structure when utilizing low-k dielectric and improving reliability of the interconnect structure.

In some embodiments, a reliable composite etch stop layer is provided and reliability performance of a semiconductor device utilizing low-k dielectric can be thus insured.

In some embodiments, an improved composite etch stop layer is provided to a semiconductor device with less or no concerns of the etch stop layer oxidizing conductive material such as copper or copper alloy that may be present in the underlying layer.

In some embodiments, an improved composite etch stop layer with higher etch selectivity relative to the dielectric layer is provided.

In some embodiments, an improved etch stop bi-layer is provided to improve reliability performance such as EM (electro migration) and TDDB (time dependent dielectric breakdown) of an interconnect structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device with composite etch stop layer, comprising:
   providing a substrate having a conductive member;
   forming a first etch stop layer on the conductive member and the substrate, covering the conductive member and the substrate;
   forming a second etch stop layer on the first etch stop layer, covering the first etch stop layer, wherein the second etch stop layer comprises silicon oxycarbide bonded with an organic group selected from the group consisting of alkyl group, phenyl group, and cyclic group;
   forming a dielectric layer over the second etch stop layer;
   sequentially patterning the dielectric layer, the second etch stop layer and the first etch stop layer to form an opening therein, exposing the substrate and a portion of the conductive member; and
   filling the opening with conductive material to form a conductive feature, electrically connecting the conductive member.

2. The method of claim 1, wherein the first etch stop layer comprises silicon carbide.

3. The method of claim 2, wherein dielectric layer comprises organo silicate glass (OSG).

4. The method of claim 1, wherein dielectric layer has a dielectric constant less than 4.0.

5. The method of claim 1, wherein the first etch stop layer has a thickness about 20~100 Å.

6. The method of claim 1, wherein the second etch stop layer has a thickness about 300~600 Å.

7. The method of claim 1, wherein the conductive material comprises copper or copper alloy.

8. The method of claim 1, wherein the conductive feature is a conductive plug or a conductive line.

9. A semiconductor device, comprising:
a substrate having a conductive member: and
an interconnect structure, comprising:
a first etch stop layer on the substrate and the conductive member, covering the substrate and the conductive member;
a second etch stop layer on the first etch stop layer, covering the first etch stop layer, wherein the second etch stop layer comprises silicon oxycarbide bonded with an organic group selected from the group consisting of alkyl group, phenyl group, and cyclic group;
a dielectric layer over the second etch stop layer; and
a conductive feature in the dielectric layer, the second etch stop layer and the first etch stop layer, electrically connecting the conductive member.

10. The semiconductor device of claim 9, wherein dielectric layer has a dielectric constant less than 4.0.

11. The semiconductor device of claim 9, wherein dielectric layer comprises organo silicate glass (OSG).

12. The semiconductor device of claim 9, wherein the first etch stop layer has a thickness about 20~100 Å.

13. The semiconductor device of claim 9, wherein the second etch stop layer has a thickness about 300~600 Å.

14. The semiconductor device of claim 9, wherein the conductive member comprises copper or copper alloy.

15. The semiconductor device of claim 9, wherein the conductive member is a conductive plug or a conductive line.

16. A semiconductor device, comprising:
a substrate having a copper line:
a first etch stop layer on the substrate and the copper line, wherein the first etch stop layer is oxygen-free:
a second etch stop layer on the first etch stop layer, wherein the second etch stop layer is oxygen-containing and comprises silicon oxycarbide bonded with an organic group selected from the group consisting of alkyl group, phenyl group, and cyclic group;
a dielectric layer over the second etch stop layer; and
a conductive plug in the dielectric layer, the second etch stop layer and the first etch stop layer, electrically connecting the copper line.

* * * * *